US011451310B1

(12) United States Patent
Shah (10) Patent No.: US 11,451,310 B1
(45) Date of Patent: Sep. 20, 2022

(54) RF POWER DETECTOR

(71) Applicant: QUALCOMM Incorporated, San Diego, CA (US)

(72) Inventor: Peter Shah, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/207,121

(22) Filed: Mar. 19, 2021

(51) Int. Cl.
| H04B 1/04 | (2006.01) |
| H04B 17/10 | (2015.01) |
| G01R 21/00 | (2006.01) |
| H04W 24/02 | (2009.01) |
| H03G 3/30 | (2006.01) |

(52) U.S. Cl.
CPC ........... *H04B 17/101* (2015.01); *G01R 21/00* (2013.01); *H04B 1/04* (2013.01); *H04W 24/02* (2013.01); *H03G 3/3042* (2013.01); *H04B 2001/0416* (2013.01)

(58) Field of Classification Search
CPC ........ H04B 1/04; H04B 17/10; H04B 17/101; H04W 24/02; G01R 21/00
See application file for complete search history.

(56) References Cited

U.S. PATENT DOCUMENTS

| 6,519,293 | B1 | 2/2003 | Miyake |
| 10,164,593 | B1 | 12/2018 | Harwalkar et al. |
| 2020/0083796 | A1* | 3/2020 | Veeramreddi ......... H02M 1/083 |
| 2020/0264217 | A1* | 8/2020 | Costa .................... H03F 1/0211 |
| 2022/0026475 | A1* | 1/2022 | Kuo ................. G01R 19/16538 |
| 2022/0037926 | A1* | 2/2022 | Omori ................... H02J 50/402 |

OTHER PUBLICATIONS

International Search Report and Written Opinion dated Jun. 24, 2022, in corresponding PCT International Appl. No. PCT/US2022/017772, 57 pages.

* cited by examiner

*Primary Examiner* — Thanh C Le
(74) *Attorney, Agent, or Firm* — Haynes and Boone, LLP (57) ABSTRACT

An RF power detector controls an amplitude of a replica input signal so that a power of the replica input signal substantially equals a power of an input signal to the RF power detector. A signal generator generates the replica input signal responsive to a digital control word. A feedback circuit adjusts the digital control word responsive to a comparison of output signals from an analog power sensor.

30 Claims, 6 Drawing Sheets

RF POWER DETECTOR

TECHNICAL FIELD

This application relates to radio frequency applications, and more particularly to a radio frequency (RF) signal power detector.

BACKGROUND

An RF transceiver may use an RF power detector for both monitoring transmit (TX) signal power as well as monitoring receive (RX) signal power. For example, a base station may assign a certain transmit power to a user equipment (UE) such as a cellular telephone so that an uplink signal from the UE does not interfere with the transmissions from other UEs. By monitoring the transmit signal power with an RF power detector, the UE can then assure that it is transmitting with the assigned signal power. Similarly, an RF receiver may use an RF power detector to control its automatic gain control (AGC) levels.

Despite the need for RF power detection in both the TX and RX paths, the performance of existing RF power detectors may be limited by issues such as DC offset, limited dynamic range, and changes in conversion characteristic (the RF power level being measured to form a corresponding digital output) over process, voltage, and temperature (PVT) corners.

SUMMARY

A power detector is disclosed that includes: an analog power sensor; a comparator configured to compare a first power signal from the analog power sensor to a second power signal; a signal generator configured to generate a replica input signal having an amplitude responsive to a digital control word; and a feedback logic circuit configured to generate the digital control word responsive to an output signal from the comparator.

In addition, a method of power detection is disclosed that includes: during a first phase of a clock signal, passing a radio frequency input signal through an analog power sensor to produce a first power signal; during a second phase of the clock signal: generating a replica input signal responsive to a digital control word; passing the replica input signal through the analog power sensor to produce a second power signal; and adjusting the digital control word to measure a power of the radio frequency input signal Moreover, a power detector is disclosed that includes: an analog power sensor; a switching network configured to pass an input signal during a first phase of operation to the analog power sensor and to pass a replica input signal during a second phase of operation to the analog power sensor; a signal generator configured to generate the replica input signal responsive to a digital control word; and a feedback circuit configured to generate the digital control word.

Finally, a power detector is disclosed that includes: an analog power sensor; a signal generator configured to generate a replica input signal responsive to a digital control word; a switching network configured to pass an input signal to the analog power sensor during a first phase of operation and to pass the replica input signal to the analog power sensor during a second phase of operation, and an analog-to-digital converter configured to digitize a reference power signal from the analog power sensor during the second phase of operation and to digitize a first power signal from the analog power sensor during the first phase of operation.

These and other advantageous features may be better appreciated through the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
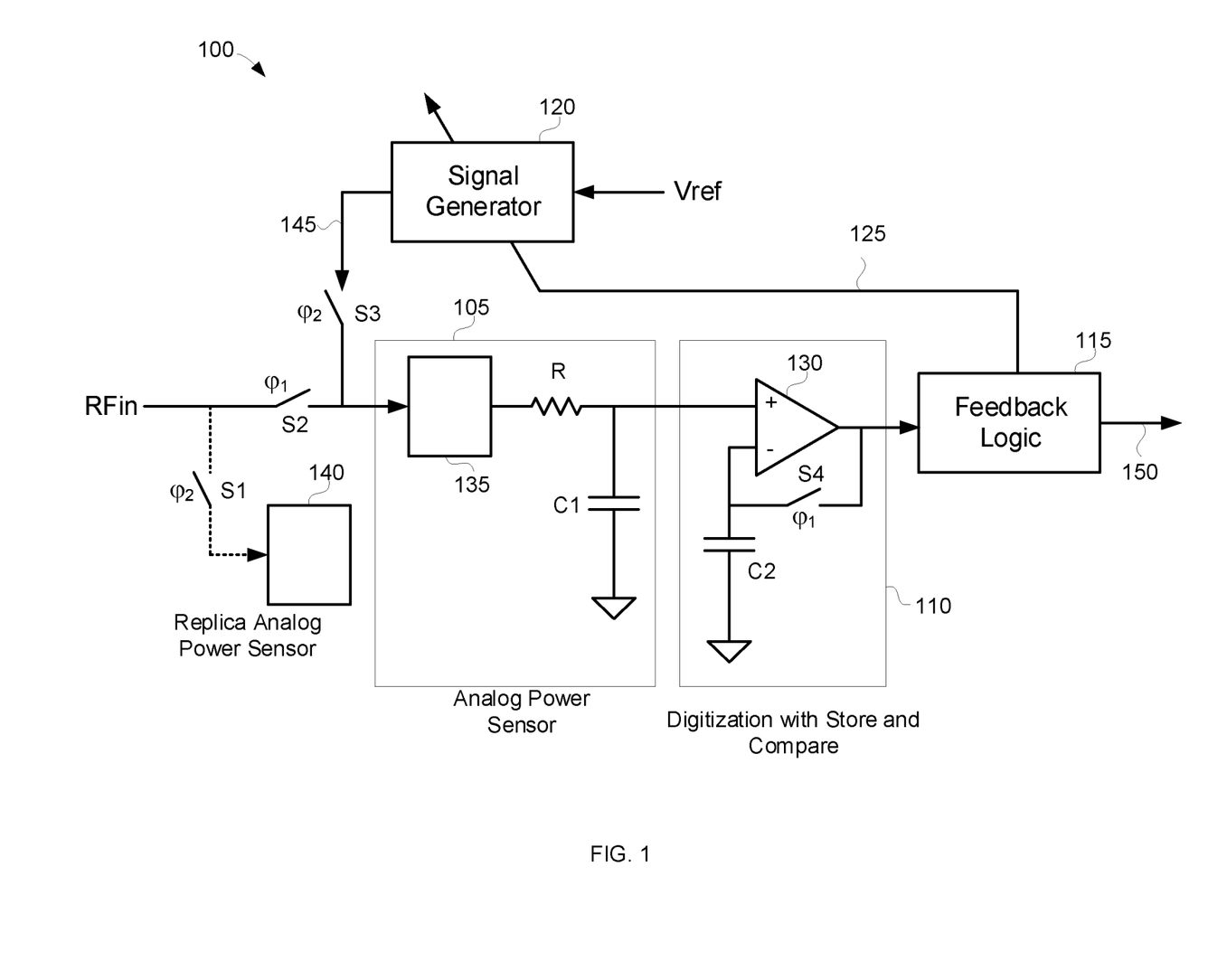
FIG. 1 illustrates an example RF power detector in accordance with an aspect of the disclosure.

One type of RF power detector includes an analog power sensor that converts an RF input signal being measured into an analog output signal (e.g., an analog voltage output signal). In such RF power detectors, an analog-to-digital converter (ADC) may digitize the analog output signal into a digital output that is a digital representation of the RF input signal power. The analog power sensor may be a square-law detector producing an analog power signal that is a function of a square of the RF input signal. More generally, the analog power sensor functions to produce an analog power signal that is a function of the RF input signal power or that is indicative of a power level of the RF input signal power. But both the analog power sensor and the ADC may need to be accurately characterized over PVT corners, which considerably complicates and burdens RF power detector design. In addition, a DC offset for the analog power sensor affects its accuracy. An RF power detector is provided herein, however, in which the PVT variations for the analog power sensor are substantially immaterial to the resulting power measurement and require virtually no calibration. An example RF power detector 100 is shown in FIG. 1. An analog power sensor 105 receives through a switch S2 an RF input signal (RFin) whose power is being detected. Analog power sensor 105 includes a detector 135 such as a diode or a metal-oxide semiconductor field-effect transistor (MOSFET) that converts the RF input signal into an analog first power signal that is a function of the power of the RF input signal. Analog power sensor 105 may also include a low-pass filter such as formed by a serial combination of a resistor and a capacitor C1 to filter the first power signal. In analog power sensor 105, the power signal is a voltage signal, but it may be a current signal or a charge signal in alternative implementations. More generally, analog power sensor 105 functions to convert an input signal to a power signal.

A digitization with store and compare circuit 110 functions to compare the first power signal from analog power sensor 105 to a second power signal to produce a digital output signal. For example, the digital output signal may be a binary output signal whose binary state depends upon whether the second power signal is greater than or less than the first power signal. Such a digital output signal may be generated in various fashions. In one implementation, circuit 110 includes a comparator 130 that compares the second power signal to the first power signal as stored on a capacitor C2. Comparator 130 receives the second power signal at its positive input terminal and receives the stored first power signal at its negative input terminal in some embodiments. The negative input terminal of comparator 130 couples through a switch S4 to an output terminal for comparator 130. A clock signal from a clock source alternates between a clock phase $\varphi 1$ and a clock phase $\varphi 2$ to control switches S2 and S4. For example, clock phase $\varphi 1$ may correspond to when the clock signal is asserted to a power supply voltage whereas clock phase $\varphi 2$ may correspond to when the clock signal is grounded although these clock phases may be reversed in alternative implementations. Clock phase $\varphi 1$ may be deemed as a sampling phase as switches S2 and S4 are both configured to close during clock phase $\varphi 1$. The RF input signal thus couples through switch S2 during the sampling phase to be converted by analog power sensor 105 into the first power signal received at comparator 130. Since switch S4 is closed, the feedback through comparator 130 causes the signal stored on capacitor C2 to equal the first power signal. The RF input signal power is thus sampled during the sampling phase to be stored across capacitor C2 as the first power signal. It will be appreciated that comparator 130 functions as an operational amplifier during clock phase $\varphi 1$ to establish a virtual ground between its inverting and non-inverting input terminals. In that regard, the terms "comparator" and "operational amplifier" are used interchangeably herein. It will be appreciated, however, that comparator 130 may be strictly a comparator in alternative implementations. The voltage stored across capacitor C2 in clock phase $\varphi 1$ not only includes the first power signal but also a DC offset of comparator 130. This DC offset is effectively cancelled during clock phase $\varphi 2$ as will be further described herein.

Clock phase $\varphi 2$ may be deemed to be a measuring or detecting clock phase as compared to the clock phase $\varphi 1$. During the measuring phase, both switches S2 and S4 are opened and a switch S3 is closed so that the first power signal may be measured through a comparison to the second power signal. Switch S3 couples between a signal generator 120 and an input terminal for analog power sensor 105. Analog power sensor 105 thus functions during the measuring phase to detect the input power for a replica input signal 145 generated by signal generator 120. A feedback logic circuit 115 controls signal generator 120 through a digital control word 125 to either increase or decrease an amplitude of the replica input signal 145 such that a power for the replica input signal 145 substantially equals the RF input signal power that was sampled and stored on capacitor C2. Feedback logic circuit 115 may be implemented using a state machine, a microcontroller, a microprocessor, or other suitable digital logic circuit. Signal generator 120 responds to the digital control word 125 to generate replica input signal 145. For example, in one implementation, signal generator 120 may attenuate a reference signal such as a reference voltage Vref responsive to the digital control word 125 to form the replica input signal 145. During clock phase $\varphi 2$, comparator 130 compares the second power signal from the analog power sensor 105 to the stored voltage on capacitor C2 minus the DC offset voltage. The DC offset voltage for comparator 130 is thus cancelled between clock phases $\varphi 1$ and $\varphi 2$.

The replica input signal 145 from signal generator 120 oscillates according to a signal frequency that need not match the frequency of the RF input signal. It is convenient if the replica input signal 145 oscillates in a digital clock signal fashion from a low value (e.g., ground) to a high value that equals the reference voltage Vref times a proportionality constant that is adapted by the feedback logic circuit 115. The reference voltage Vref may have an amplitude that is greater than the largest-expected amplitude for the RF input signal. Depending upon the feedback from the feedback logic circuit 115, signal generator 120 then reduces the amplitude of its replica input signal 145 so that the signal power for the replica input signal 145 substantially equals the RF input signal power sampled and stored on capacitor C2.

In one implementation, feedback logic circuit 115 may function analogously to the control in a successive approximation register (SAR) analog-to-digital converter. For example, suppose that signal generator 120 can adjust its output signal amplitude across a 3-bit dynamic range. There would then be eight possible values of attenuation applied with respect to the amplitude of the reference voltage signal Vref. Feedback logic circuit 115 may then begin the detection process by choosing a mid-level value for the output signal amplitude such as ½ Vref. Comparator 130 will then indicate whether this initial value is too large (the comparator output being a binary zero) or too small (the comparator output being a binary one). Suppose that the comparison shows that ½ Vref is too small of an amplitude. The feedback logic circuit 115 may then increase the amplitude of the replica input signal 145 to some higher value such as ¾ Vref, and so on. The same sort of successive approximation would occur if the initial comparison indicated that ½ Vref was too large although in that case the feedback logic circuit 115 may successively lower the amplitude of the replica input signal 145. It will be appreciated that the number of bits for the dynamic range of signal generator 120 may be greater than or less than 3 bits in alternative implementations. For example, the digital control word 125 may be a binary signal in some implementations. The replica signal power will thus have two possible values in such implementations: a low value and a high value that is greater than the low value. The measurement phase may then begin with the analog power sensor 105 sensing the power of the low value for the replica input signal 145. If the comparison by comparator 130 indicates that the RF input signal power is less than the low value of the replica input signal power, the measurement phase is completed. However, if the comparison indicates that the RF input signal power is greater than this low value, the measurement phase continues with the digital control word 125 forcing signal generator 120 to generate the replica input signal 145 to have the higher power value. After the analog power sensor 105 senses this high power value to produce the corresponding power signal, comparator 130 again compares the power signal to the stored power signal to determine if the RF input signal power is greater than the higher value. It may thus be appreciated that the resulting measurement phase has 1.5 bits of dynamic range in that the RF input signal power is determined to: 1) lower than the low value, 2) in between the low value and the high value, or 3) greater than the high value. The digital control of the attenuation by signal generator 120 by feedback logic circuit 115 advantageously provides an inherent digitization of the output power measurement. For example, the digital control word 125 may also function as a digital power output or measurement 150 from RF power detector 100 of the RF input signal power.

To equalize the input impedance and loading of the RF input signal, the RF input signal may couple through a switch S1 to a replica analog power sensor 140. Switch S1 is configured to close during the measuring clock phase φ2 and to be open during the sampling clock phase φ1. Replica analog power sensor 140 is configured to provide the same loading (the same input impedance) as analog power sensor 105 does to the RF input signal. The analog power sensor 105 provides its loading of the RF input signal during the sampling clock phase φ1 though the closing of switch S2 and is then isolated from the RF input signal during the measuring clock phase φ2 by the opening of switch S2. This same loading is then applied by the replica analog power sensor 140 during the measuring clock phase φ2 through the closing of switch S1 so that the RF input signal is subjected to a constant loading.

Referring again to RF power detector 100, note that store and compare circuit 110 may instead be an analog-to-digital converter (ADC) 110 in alternative implementations. In such implementations, the ADC 110 digitizes the analog power signal from analog power sensor 105 to form a digital value. There is thus no need for a capacitor to store such a digital value. Instead, the ADC 110 may include a digital memory. In one ADC implementation, clock phase φ1 results in the ADC 110 storing a digitized value of the RF input signal power. In clock phase φ2, the ADC 110 stores a digitized value of the replica signal power. Feedback logic 115 may thus function as described previously to adjust the digital control word 125 until the digitized value of the replica signal power substantially equals the digitized value of the RF input signal power. In another ADC implementation, the oscillation of a clock signal between the clock phases φ1 and φ2 is not used. For example, during an initialization phase in which switch S3 is closed and switch S2 opened, feedback logic 115 may sweep through all the possible values for the digital control word 125. The replica input signal 145 will thus be similarly swept through all its possible amplitudes and converted by analog power sensor 105 into corresponding reference (second) power signals. The ADC 110 digitizes all these reference power signals and stores the resulting digitized reference power signals. A subsequent measurement phase may continuously measure the RF input signal power by keeping switch S2 closed and switch S3 opened. For each measurement during the measurement phase, the RF input signal passes through analog power sensor 105 to form an input power signal that is digitized by ADC 110 into a digitized input power signal. Feedback logic 115 may then compare this digitized input power signal to the stored digitized reference power signals and form digital power output 150 by setting digital power output 150 equal to the digital control word 125 that produced the stored digitized reference power signal that most closely equals the digitized input power signal.

As discussed previously, another approach to RF signal power detection involved the use of an analog power sensor and an ADC. Since the analog power sensor and ADC are prone to PVT variations, the analog power sensor and ADC typically required careful characterization of the PVT variations in order that they may be compensated. In RF power detector 100, the need for accuracy and robustness to PVT variations is instead placed on the signal generator 120. But maintaining an accurate signal generation of replica input signal 145 by signal generator 120 may be more easily or cost-effectively implemented and designed as compared to maintaining the accuracy of an analog-signal-generator-and-an-ADC combination. For example, the attenuation within signal generator 120 may be based on a resistive divider or a capacitive divider. In a resistor divider, the attenuation is based upon a ratio of resistances for corresponding resistors. Although these resistances will be subjected to PVT variation, the same PVT variation will generally occur to each resistance in the resulting ratio of resistances from the resistive divider. The division of resistances in a resistive divider thus substantially cancels the PVT variation. A similar PVT variation occurs to the individual capacitances in a capacitive divider such that the PVT variation for a capacitive divider is also substantially eliminated.

Figure 2A:
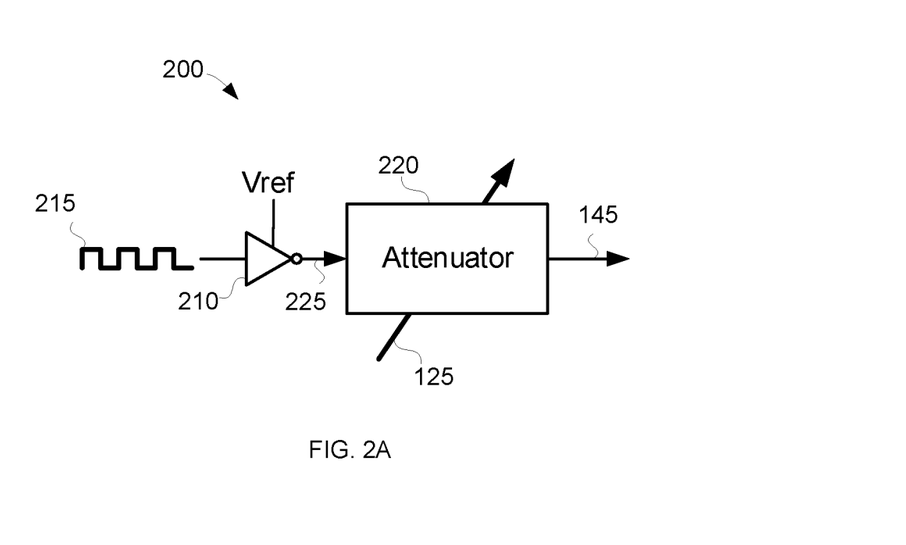
FIG. 2A illustrates a signal generator in which an attenuator attenuates the replica input signal produced by the signal generator in accordance with an aspect of the disclosure.

An example signal generator 200 is shown in more detail in FIG. 2A. An attenuator 220 may attenuate using either resistive or capacitive division. The reference voltage Vref functions as a power supply voltage to an inverter 210 that inverts an oscillating signal 215 to provide an input signal 225 to attenuator 220. Inverter 210 may be replaced by a buffer or another suitable circuit such as an amplifier in alternative implementations. Inverter 210 is thus an example of a circuit that converts oscillating signal 215 into a converted oscillating signal that oscillates between ground and the reference voltage Vref. The input signal 225 will thus oscillate between ground (or some suitable low voltage) and the reference voltage Vref at the frequency of the oscillating signal 215. Attenuator 220 attenuates the input signal 225 responsive to the digital control word 125 to produce the replica input signal 145. Although signal generator 200 is advantageously robust to PVT variations, the input signal 225 is oscillating at the frequency of the oscillating signal 215 such that the parasitic effects within attenuator 220 may affect the accuracy of operation.

Figure 2B:
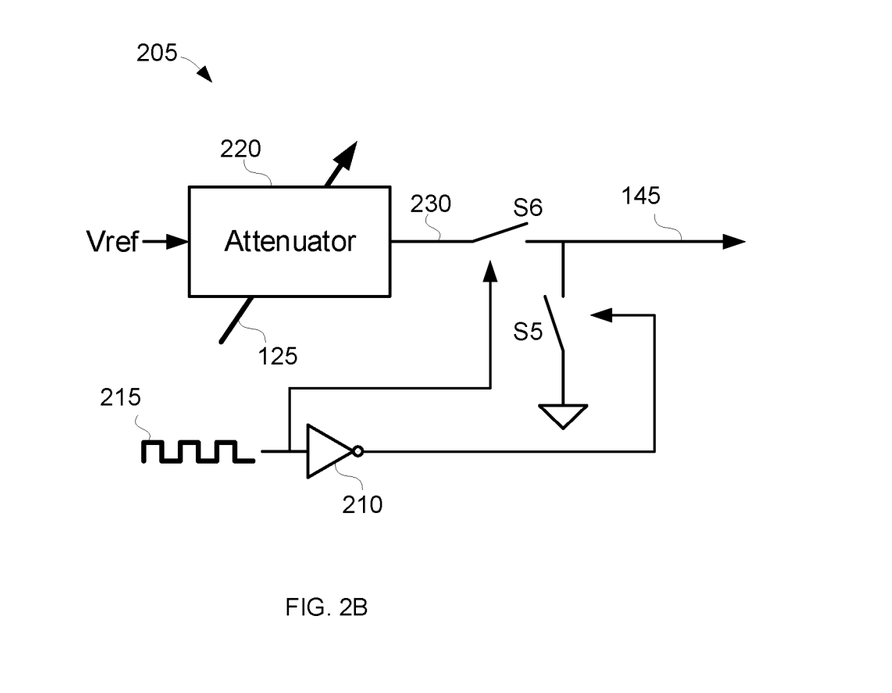
FIG. 2B illustrates a signal generator in which an attenuator attenuates the reference voltage for the signal generator in accordance with an aspect of the disclosure.

An alternative signal generator 205 shown in FIG. 2B uses attenuator 220 to attenuate the reference voltage Vref responsive to the digital control word 125 to form an attenuated DC voltage 230. Attenuator 220 then operates at DC such that parasitic effects are substantially eliminated. The oscillating signal 215 (e.g., a source clock signal) and an inverted version of the oscillating signal 215 from inverter 210 control the switching of a switch S6 and a switch S5 to convert the attenuated voltage 230 into the replica input signal 145. During a first phase of the oscillating signal 215, switch S6 is closed and switch S5 is opened such that the attenuated voltage 230 is passed through switch S6 to form a high state for the replica input signal 145. During a second phase of the oscillating signal 215, switch S6 is opened and switch S5 closes. Switch S5 couples between ground and a node for the replica input signal 145. The replica input signal 145 is thus grounded while switch S5 is closed. As the oscillating signal 215 oscillates at its source clock signal frequency, the replica input signal 145 oscillates at the same source clock signal frequency between ground and the attenuated voltage 230. Signal generator 205 is thus not only robust to PVT variations but will have accurate attenuation in attenuator 220 since attenuator 220 is merely attenuating the DC reference voltage Vref in signal generator 205.

The following discussion will address some resistive divider implementations for attenuator 220. For example, attenuator 220 may be implemented as shown for a logarithmic resistive divider ladder 300 in FIG. 3. The digital control word 125 controls a switch network 305 ranging from an initial switch S7 through an Nth switch SN, N being a plural positive integer. Except for the initial switch S7, each switch couples to a corresponding rung of the resistive divider ladder 300. For example, a switch S8 connects from a node for the attenuated voltage 230 to an input node 310 for a corresponding resistor Rb that connects to ground. Another switch S9 connects from the node for the attenuated voltage 230 to an input node 311 for a corresponding resistor Rb, and so on for the remaining switches (except for the input switch S7). A corresponding resistor Ra connects between adjacent ones of the input nodes. An initial resistor Ra connects between the node 310 and an input node for the reference voltage Vref. Resistive divider ladder 300 thus functions as attenuator 220 in signal generator 205 in that resistive divider ladder 300 divides the reference voltage Vref responsive to the digital control word 125 to form the attenuated voltage 230. However, it will be appreciated that resistive divider ladder 300 may instead function to divide the input signal 225 to form replica input signal 145 as discussed for signal generator 200.

Figure 3:
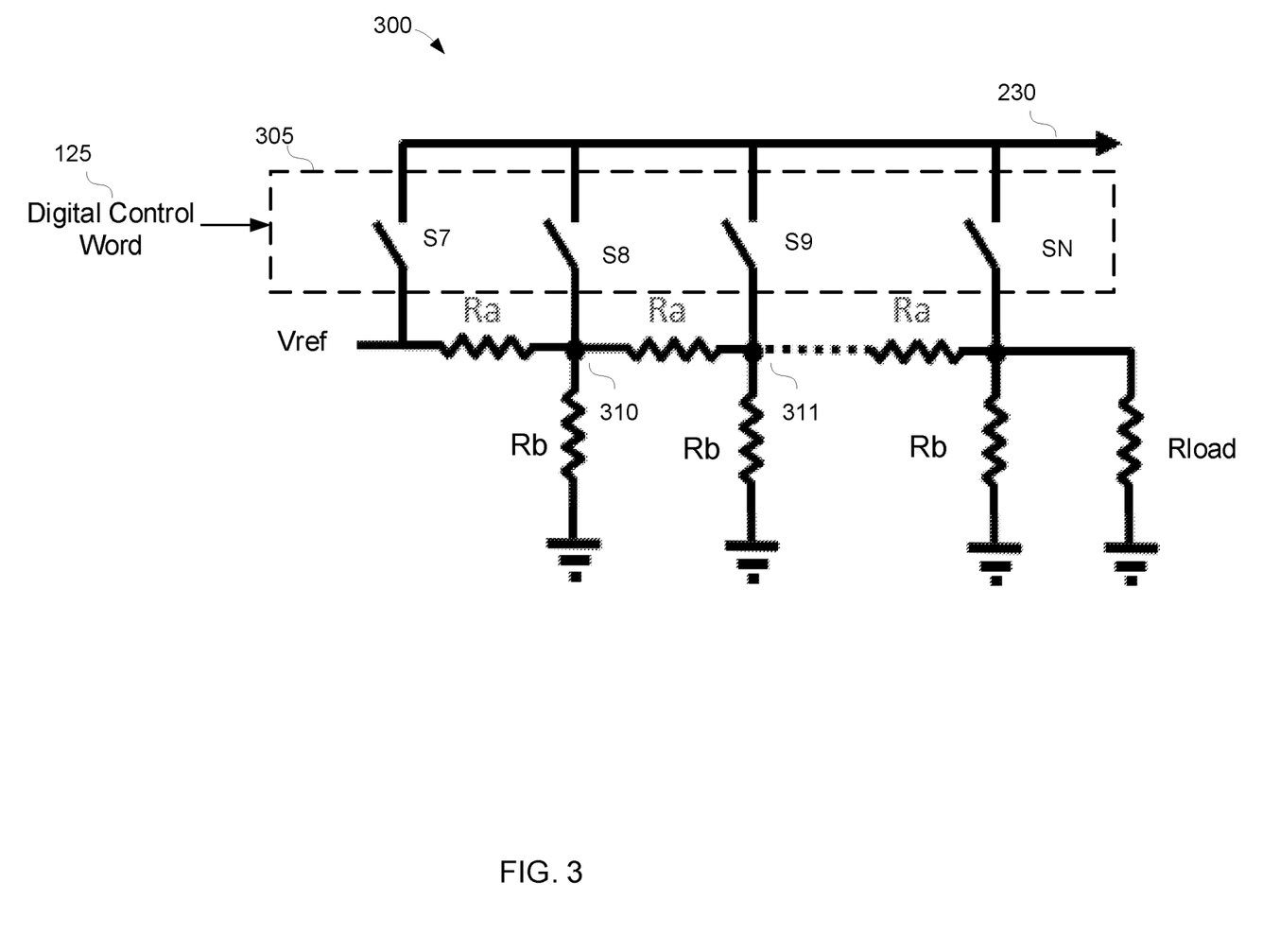
FIG. 3 illustrates a logarithmic resistive divider with equal attenuation steps in accordance with an aspect of the disclosure.

A load resistor Rload connects in parallel with the resistor Rb for the rung controlled by the Nth switch SN. If the resistance of resistor Ra equals a factor $(1-\alpha)$ times a resistance Rload for the resistor Rload and the resistance of resistor Rb equals a ratio of $\alpha/(1-\alpha)$ times the resistance Rload, where $0 \leq \alpha \leq 1$, then it may be shown that the attenuated voltage 230 equals $\alpha^n$ times the reference voltage Vref, where n is the number of the rungs to each have its switch closed beginning with switch S7, where n=0. The further down the location of the closed switch, the greater will be the attenuation. For the special case of a equals ½, resistive divider ladder 300 becomes an R-2R ladder that provides attenuation in 6 dB steps. The resistance Rb is then equal to Rload and the resistance Ra is ½ Rload. In that case, the attenuated voltage 230 in decibels (dB) equals the decibel level for the reference voltage Vref (Vref dB) minus 6n. For example, if switch S8 is closed, the attenuation would be 6 dB. If switches S9 is closed, the attenuation is 12 dB. As the location of the closed switch moves down the chain, the attenuation continues to increase in increments of 6 dB. But if the initial switch S7 is closed, there is no attenuation such that the attenuated voltage 230 equals the reference voltage Vref (corresponding to an attenuation of 6n, n being zero).

As the parameter a is changed, the dB increments of attenuation from resistive divider ladder 300 change accordingly. Referring back to FIG. 1, note that RF power detector 100 may need to operate across a relatively broad dynamic range. To satisfy such as broad dynamic range, the dB increments of attenuation may be relatively large such as the 6 dB example discussed to keep the number or rungs at a manageable level yet still offer a large dynamic range of attenuation. But the accuracy of the power determination may be limited by the relatively coarse attenuation steps. For a given power level of the RF input signal, comparator 130 may only indicate that for a first value of the digital control word 125 and a corresponding setting of the attenuation in signal generator 120, the power level of the RF input signal is less than the power for replica input signal 145. At a subsequent increment of the attenuation as controlled by a second value of the digital control word 125, the power level of the RF input signal may become greater than the power for replica input signal 145. In such an example, the power level of the RF input signal lies somewhere between the power indicated by the first value of the digital control word 125 and the power indicated by the second value of the digital control word 125. The maximum uncertainty in the power determination is thus equal to the attenuation increment in dB. To increase the accuracy of the power determination, the dB increments of attenuation may be made smaller.

Figure 4:
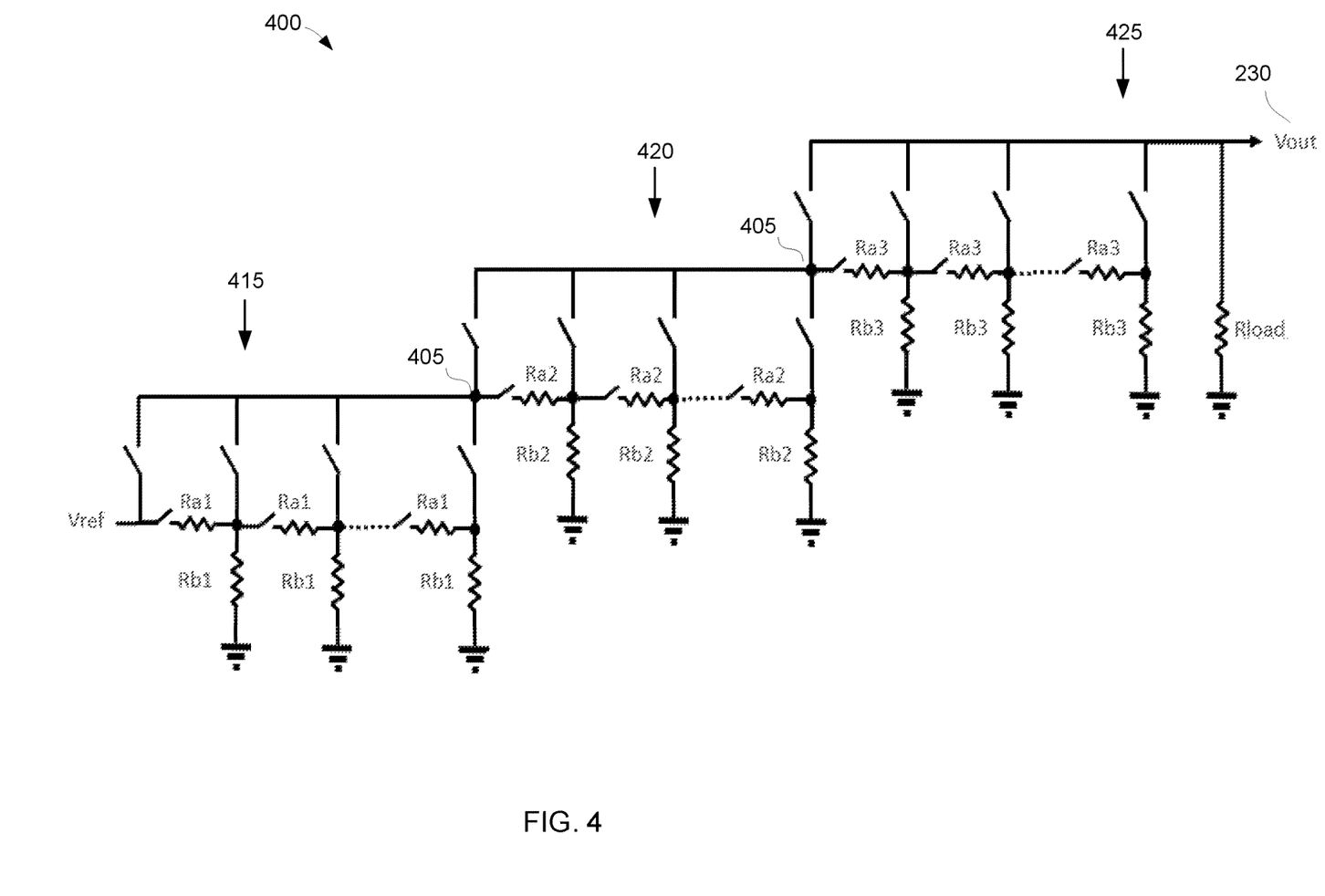
FIG. 4 illustrates a cascaded logarithmic resistive divider with coarse and fine attenuation steps in accordance with an aspect of the disclosure.

To achieve both a large dynamic range and improved accuracy, a cascaded resistive divider ladder 400 may be used as shown in FIG. 4. As implied by the designation of "cascaded" resistive divider ladder 400 subdivides the attenuation across several sub-ladders, each sub-ladder having a different magnitude for the attenuation increment. For example, resistive divider ladder 400 has a first sub-ladder 415 that attenuates the reference voltage Vref to provide a first attenuated voltage at an output node 405. The first attenuated voltage functions as an input voltage for a second sub-ladder 420 that may further attenuate the first attenuated voltage into a second attenuated voltage at an output node 410. A third resistive sub-ladder 425 may attenuate the second attenuated voltage to form the attenuated voltage 230. Note that the attenuation increment for each successive sub-ladder is independent of the preceding sub-ladder's attenuation increment. Thus, the order of the attenuation increment magnitude across the sub-ladders need not be decreasing but may be increasing or randomized in other implementations.

Each of the sub-ladders 415, 420, and 425 may be implemented as discussed for resistive divider ladder 300. But the resistors Ra and Rb in sub-ladders 415, 420, and 425 are adapted according to the desired cascading. For example, sub-ladder 415 may be configured to provide relatively coarse increments of attenuation such that sub-ladder 415 constructs its rungs from resistors Ra1 and Rb1 that have resistances providing the desired relatively coarse steps in attenuation. Similarly, sub-ladder 420 uses resistors Ra2 and Rb2 such that sub-ladder 420 may provide more finer steps in attenuation. Finally, sub-ladder 425 uses resistors Ra3 and Rb3 that provide even finer steps in attenuation. For example, suppose the desired accuracy is within 1 dB for the power measurement in RF power detector 100. A sub-ladder offering relatively fine increments of attenuation such as sub-ladder 425 may be configured accordingly to provide such 1 dB increments of attenuation. Sub-ladder 420 may also be configured to provide 2 dB increments of attenuation whereas sub-ladder 415 may be configured to provide 6 dB increments of attenuation. It will be appreciated that the number of sub-ladders and their respective increments of attenuation may be varied in alternative embodiments.

Figure 5:
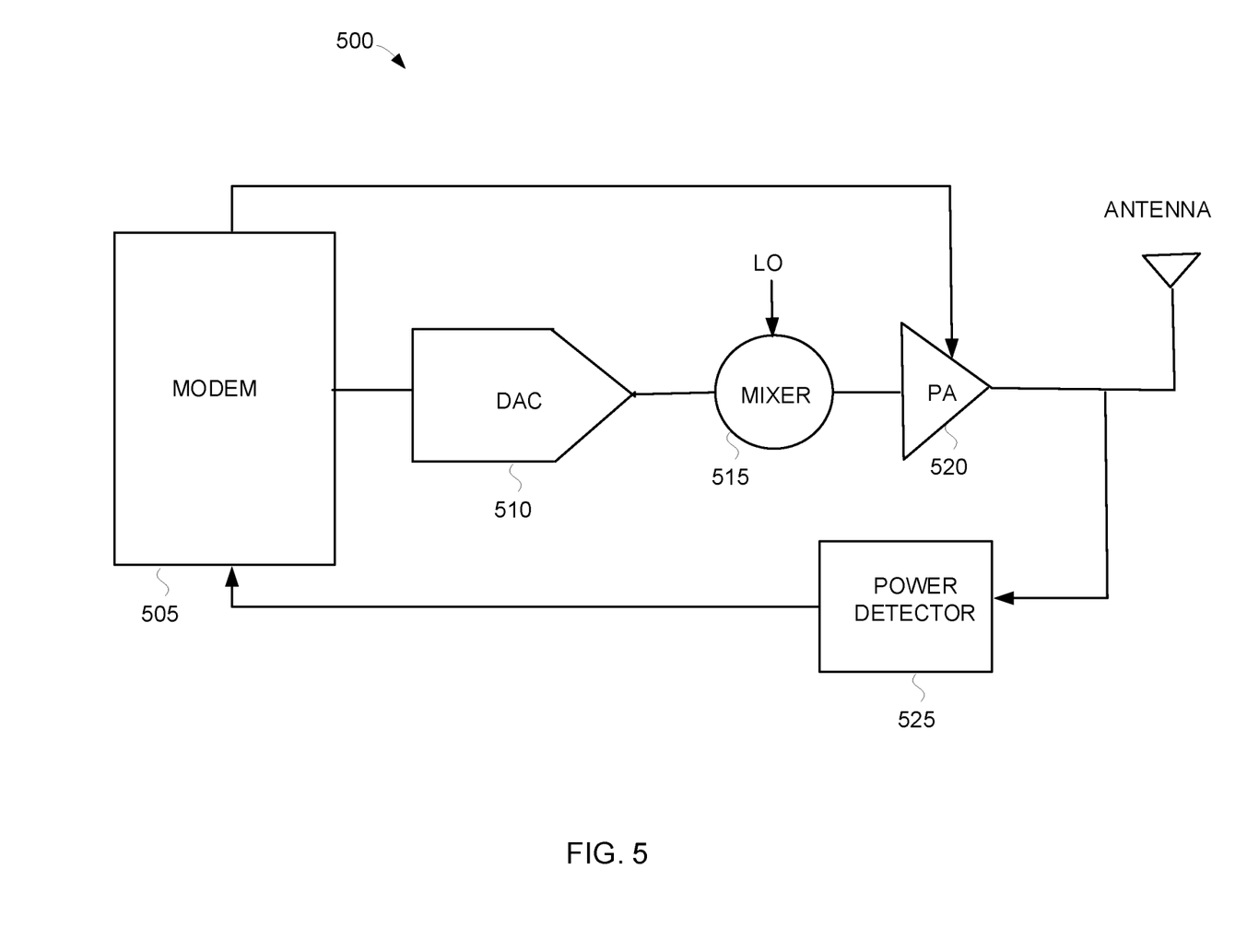
FIG. 5 illustrates a transmitter including a power detector in accordance with an aspect of the disclosure.

A power detector as disclosed herein may be incorporated into a transmitter, a receiver, or a transceiver. An example transmitter 500 for a cellular telephone is shown in FIG. 5. A modem 505 generate a digital baseband signal that is converted into an analog baseband signal by a digital-to-analog converter (DAC) 510. A mixer 515 upconverts the analog baseband signal into an RF signal. It will be appreciated that several up-conversion stages such as in a heterodyne architecture may be used that are represented by mixer 515. A power amplifier (PA) 520 amplifies the RF signal to form an amplified RF signal that transmits over an antenna (or an array of antennas). A power detector 525 as disclosed herein samples the amplified RF signal such as through a directional coupler (not illustrated) to generate a digital output signal that represents a measured power for the amplified RF signal. Modem 505 adjusts a power amplification by power amplifier 520 responsive to the digital output signal so that a transmitted RF signal has a desired transmit power. In alternative implementations, power detector 525 may instead (or in addition to) detect the power of an intermediate frequency signal in the up-conversion chain in transmitter 500.

Figure 6:
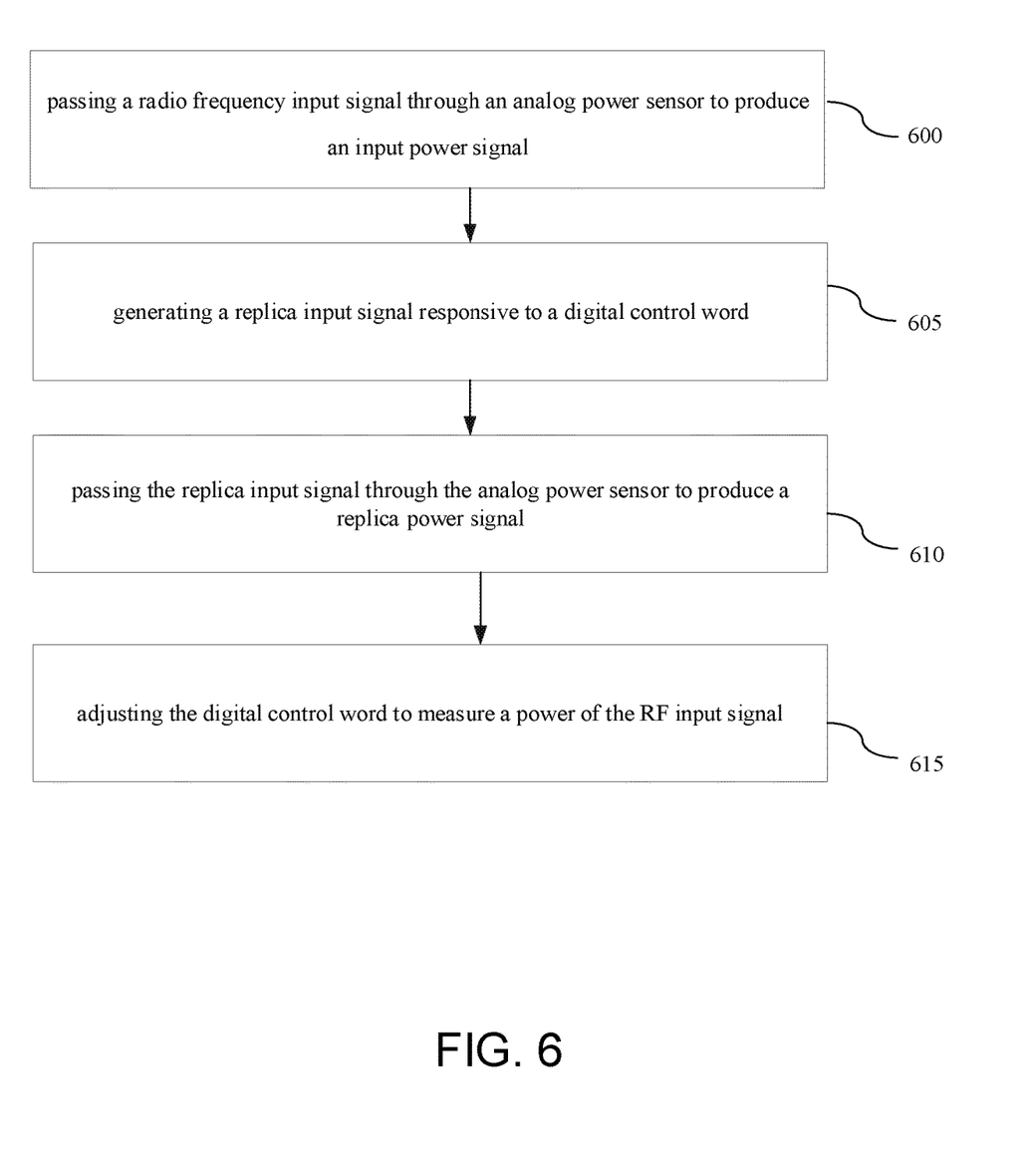
FIG. 6 is a flowchart for an example method of power detection in accordance with an aspect of the disclosure.

A method of power detection will now be discussed with regard to the flowchart of FIG. 6. The method includes an act 600 of passing a radio frequency input signal through an analog power sensor to produce a first power signal. The passing of the RF input signal through analog power sensor 105 to develop a stored voltage in circuit 110 is an example of producing the first power signal in act 600. The method also includes an act 605 of generating a replica input signal responsive to a digital control word. The operation of signal generator 120 to develop the replica input signal 145 is an example of act 605. In addition, the method includes an act 610 of passing the replica input signal through the analog power sensor to produce a second power signal. The formation of the second power signal by analog power sensor 105 during the clock phase φ2 is an example of act 610. Finally, the method includes an act 615 of adjusting the digital control word to measure a power of the RF input signal. The adjustment of the digital control word 125 by the feedback logic circuit 115 is an example of act 615.

The disclosure will now be summarized through a series of clauses:

Clause 1. A power detector, comprising:
 an analog power sensor;
 a comparator configured to compare a first power signal from the analog power sensor to a second power signal from the analog power sensor;
 a signal generator configured to generate a replica input signal having an amplitude responsive to a digital control word; and
 a feedback logic circuit configured to generate the digital control word responsive to an output signal from the comparator.

Clause 2. The power detector of clause 1, further comprising:
 a capacitor configured to store the first power signal as a voltage.

Clause 3. The power detector of clause 2, further comprising:
 a switch coupled between a first terminal of the capacitor and an output of the comparator, wherein a second terminal of the capacitor is coupled to ground.

Clause 4. The power detector of any of clauses 1-3, wherein the analog power sensor includes a square-law circuit element configured to square an input signal to the analog power sensor to provide a squared output signal.

Clause 5. The power detector of clause 4, wherein the analog power sensor further includes a filter configured to filter the squared output signal to form the first power signal.

Clause 6. The power detector of clause 5, wherein the filter is a low-pass filter.

Clause 7. The power detector of any of clauses 1-6, further comprising:
 a first switch coupled between a node for an input radio frequency (RF) signal and an input to the analog power sensor; and
 a second switch coupled between an output of the signal generator and the analog power sensor.

Clause 8. The power detector of clause 7, wherein the first switch is configured to close during a first phase for a clock signal and to open for a second phase of the clock signal, and wherein the second switch is configured to close during the second phase of the clock signal and to open during the first phase of the clock signal.

Clause 9. The power detector of any of clauses 1-8, wherein the signal generator comprises:
 a circuit configured to convert an oscillating signal into a converted oscillating signal, the circuit being powered by a reference voltage; and
 an attenuator configured to attenuate the converted oscillating signal responsive to the digital control word to form the replica input signal.

Clause 10. The power detector of any of clauses 1-9, wherein the signal generator comprises:
 an attenuator configured to attenuate a reference voltage responsive to the digital control word to form an attenuated voltage on a signal node;
 a first switch coupled between the signal node and an output node for the signal generator; and
 a second switch coupled between the signal node and ground.

Clause 11. The power detector of clause 10, wherein the first switch is configured to close during a first phase of an oscillating signal and to open during a second phase of the oscillating signal, and wherein the second switch is configured to close during the second phase of the oscillating signal and to open during the first phase of the oscillating signal.

Clause 12. The power detector of clause 10, wherein the attenuator is a resistive divider ladder having a plurality of rungs.

Clause 13. The power detector of clause 12, wherein the resistive divider ladder includes a switch for each rung in the plurality of rungs.

Clause 14. The power detector of clause 12, wherein the resistive divider ladder includes a plurality of sub-ladders configured to provide a range of attenuation increments for an attenuation of the reference voltage to form the attenuated voltage.

Clause 15. The power detector of any of clauses 1-14, wherein the power detector is configured to measure a power of a radio frequency (RF) signal for a transmitter.

Clause 16. The power detector of clause 15, wherein the transmitter is a transmitter for a cellular telephone.

Clause 17. A method of power detection, comprising:
 passing a radio frequency input signal through an analog power sensor to produce a first power signal;
 generating a replica input signal responsive to a digital control word;
 passing the replica input signal through the analog power sensor to produce a second power signal; and
 adjusting the digital control word to measure a power of the RF input signal.

Clause 18. The method of clause 17, wherein generating the replica input signal responsive to the digital word comprises attenuating a reference voltage signal to produce the replica input signal, and wherein adjusting the digital control word comprises controlling the attenuating of the reference voltage signal through at least a coarse increment of attenuation and through a fine increment of attenuation, the fine increment of attenuation being less than the coarse increment of attenuation.

Clause 19. The method of any of clauses 17-18, wherein generating the replica input signal responsive to the digital word comprises attenuating a reference voltage signal to produce the replica input signal, and wherein the attenuating of the reference voltage signal responsive to the digital control word to generate the replica input signal comprises:
 attenuating the reference voltage signal responsive to the digital control word to form an attenuated voltage; and
 responsive to an oscillating signal, alternating between passing the attenuated voltage and passing ground to generate the replica input signal.

Clause 20. The method of clause 19, wherein the oscillating signal has a frequency that is lower than a frequency for the radio frequency input signal.

Clause 21. A power detector, comprising:
an analog power sensor;
a switching network configured to pass an input signal during a first phase of a clock signal to the analog power sensor and to pass a replica signal during a second phase of a clock signal to the analog power sensor;
a signal generator configured to form the replica signal responsive to a digital control word; and
a feedback logic circuit configured to generate the digital control word.

Clause 22. The power detector of clause 21, further comprising:
a store and compare circuit configured to store a first power signal from the analog power sensor during the first phase of the clock signal and configured to perform a comparison of a second power signal from the power sensor during the second phase of the clock signal to the first power signal.

Clause 23. The power detector of clause 22, wherein the feedback logic circuit is further configured to generate the digital control word responsive to the comparison of the second power signal during the second phase of the clock signal to the first power signal.

Clause 24. The power detector of clause 21, wherein the switching network is further configured to couple a replica analog power sensor to a node for the input signal during the second phase of the clock signal.

Clause 25. The power detector of clause 22, further comprising a clock source for generating the clock signal.

Clause 26. The power detector of clause 25, wherein the feedback circuit is further configured to adjust the digital control word during the second phase of the clock signal until a power of the replica input signal substantially equals a power of the input signal.

Clause 27. A power detector, comprising:
an analog power sensor;
a signal generator configured to generate a replica input signal responsive to a digital control word;
a switching network configured to pass an input signal to the analog power sensor during a first phase of operation and to pass the replica input signal to the analog power sensor during a second phase of operation, and
an analog-to-digital converter configured to digitize a reference power signal from the analog power sensor during the second phase of operation and to digitize an input power signal form the analog power sensor during the first phase of operation.

Clause 28. The power detector of clause 27, further comprising:
a feedback logic circuit configured to sweep the digital control word through a range of possible values during the second phase of operation.

Clause 29. The power detector of clause 27, wherein the input signal is an RF signal for a transmitter.

Clause 30. The power detector of clause 27, wherein the input signal is an intermediate frequency signal for a transceiver.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A power detector, comprising:
an analog power sensor;
a comparator configured to compare a first power signal from the analog power sensor to a second power signal from the analog power sensor;
a signal generator configured to generate a replica input signal having an amplitude responsive to a digital control word; and
a feedback logic circuit configured to generate the digital control word responsive to an output signal from the comparator.

2. The power detector of claim 1, further comprising:
a capacitor configured to store the first power signal as a voltage.

3. The power detector of claim 2, further comprising:
a switch coupled between a first terminal of the capacitor and an output of the comparator, wherein a second terminal of the capacitor is coupled to ground.

4. The power detector of claim 1, wherein the analog power sensor includes a square-law circuit element configured to square an input signal to the analog power sensor to provide a squared output signal.

5. The power detector of claim 4, wherein the analog power sensor further includes a filter configured to filter the squared output signal to form the first power signal.

6. The power detector of claim 5, wherein the filter is a low-pass filter.

7. The power detector of claim 1, further comprising:
a first switch coupled between a node for an input radio frequency (RF) signal and an input to the analog power sensor; and
a second switch coupled between an output of the signal generator and the analog power sensor.

8. The power detector of claim 7, wherein the first switch is configured to close during a first phase for a clock signal and to open for a second phase of the clock signal, and wherein the second switch is configured to close during the second phase of the clock signal and to open during the first phase of the clock signal.

9. The power detector of claim 1, wherein the signal generator comprises:
a circuit configured to convert an oscillating signal into a converted oscillating signal, the circuit being powered by a reference voltage; and
an attenuator configured to attenuate the converted oscillating signal responsive to the digital control word to form the replica input signal.

10. The power detector of claim 1, wherein the signal generator comprises:
an attenuator configured to attenuate a reference voltage responsive to the digital control word to form an attenuated voltage on a signal node;
a first switch coupled between the signal node and an output node for the signal generator; and
a second switch coupled between the signal node and ground.

11. The power detector of claim 10, wherein the first switch is configured to close during a first phase of an oscillating signal and to open during a second phase of the oscillating signal, and wherein the second switch is configured to close during the second phase of the oscillating signal and to open during the first phase of the oscillating signal.

12. The power detector of claim 10, wherein the attenuator is a resistive divider ladder having a plurality of rungs.

13. The power detector of claim 12, wherein the resistive divider ladder includes a switch for each rung in the plurality of rungs.

14. The power detector of claim 12, wherein the resistive divider ladder includes a plurality of sub-ladders configured to provide a range of attenuation increments for an attenuation of the reference voltage to form the attenuated voltage.

15. The power detector of claim 1, wherein the power detector is configured to measure a power of a radio frequency (RF) signal for a transmitter.

16. The power detector of claim 15, wherein the transmitter is a transmitter for a cellular telephone.

17. A method of power detection, comprising:
passing a radio frequency input signal through an analog power sensor to produce a first power signal;
generating a replica input signal responsive to a digital control word;
passing the replica input signal through the analog power sensor to produce a second power signal; and
adjusting the digital control word to measure a power of the radio frequency input signal.

18. The method of claim 17, wherein generating the replica input signal responsive to the digital word comprises attenuating a reference voltage signal to produce the replica input signal, and wherein adjusting the digital control word comprises controlling the attenuating of the reference voltage signal through at least a coarse increment of attenuation and through a fine increment of attenuation, the fine increment of attenuation being less than the coarse increment of attenuation.

19. The method of claim 17, wherein generating the replica input signal responsive to the digital word comprises attenuating a reference voltage signal to produce the replica input signal, and wherein the attenuating of the reference voltage signal responsive to the digital control word to generate the replica input signal comprises:
attenuating the reference voltage signal responsive to the digital control word to form an attenuated voltage; and
responsive to an oscillating signal, alternating between passing the attenuated voltage and passing ground to generate the replica input signal.

20. The method of claim 19, wherein the oscillating signal has a frequency that is lower than a frequency for the radio frequency input signal.

21. A power detector, comprising:
an analog power sensor;
a switching network configured to pass an input signal during a first phase of a clock signal to the analog power sensor and to pass a replica input signal during a second phase of a clock signal to the analog power sensor;
a signal generator configured to form the replica input signal responsive to a digital control word; and
a feedback logic circuit configured to generate the digital control word.

22. The power detector of claim 21, further comprising:
a store and compare circuit configured to store a first power signal from the analog power sensor during the first phase of the clock signal and configured to perform a comparison of a second power signal from the power sensor during the second phase of the clock signal to the first power signal.

23. The power detector of claim 22, wherein the feedback logic circuit is further configured to generate the digital control word responsive to the comparison of the second power signal during the second phase of the clock signal to the first power signal.

24. The power detector of claim 21, wherein the switching network is further configured to couple a replica analog power sensor to a node for the input signal during the second phase of the clock signal.

25. The power detector of claim 22, further comprising a clock source for generating the clock signal.

26. The power detector of claim 25, wherein the feedback circuit is further configured to adjust the digital control word during the second phase of the clock signal until a power of the replica input signal substantially equals a power of the input signal.

27. A power detector, comprising:
an analog power sensor;
a signal generator configured to generate a replica input signal responsive to a digital control word;
a switching network configured to pass an input signal to the analog power sensor during a first phase of operation and to pass the replica input signal to the analog power sensor during a second phase of operation, and
an analog-to-digital converter configured to digitize a reference power signal from the analog power sensor during the second phase of operation and to digitize a first power signal from the analog power sensor during the first phase of operation.

28. The power detector of claim 27, further comprising:
a feedback logic circuit configured to sweep the digital control word through a range of possible values during the second phase of operation.

29. The power detector of claim 27, wherein the input signal is an RF signal for a transmitter.

30. The power detector of claim 27, wherein the input signal is an intermediate frequency signal for a transceiver.

* * * * *